(12) United States Patent
Cheong et al.

(10) Patent No.: US 10,134,681 B2
(45) Date of Patent: Nov. 20, 2018

(54) LASER PROCESSING METHOD FOR CUTTING SEMICONDUCTOR WAFER HAVING METAL LAYER FORMED THEREON AND LASER PROCESSING DEVICE

(71) Applicant: EO TECHNICS CO., LTD., Gyeonggi-do (KR)

(72) Inventors: Hoe Min Cheong, Seoul (KR); Sang Young Park, Seoul (KR)

(73) Assignee: EO TECHNICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/311,038

(22) PCT Filed: Apr. 14, 2015

(86) PCT No.: PCT/KR2015/003696
§ 371 (c)(1),
(2) Date: Nov. 14, 2016

(87) PCT Pub. No.: WO2015/174642
PCT Pub. Date: Nov. 19, 2015

(65) Prior Publication Data
US 2017/0084546 A1 Mar. 23, 2017

(30) Foreign Application Priority Data

May 14, 2014 (KR) .................. 10-2014-0057964

(51) Int. Cl.
*H01L 21/00* (2006.01)
*H01L 21/50* (2006.01)
(Continued)

(52) U.S. Cl.
CPC ........ *H01L 23/544* (2013.01); *H01L 21/0242* (2013.01); *H01L 21/02378* (2013.01);
(Continued)

(58) Field of Classification Search
CPC ....... H01L 23/29; H01L 23/562; H01L 21/78; H01L 2924/0002; H01L 2924/00
See application file for complete search history.

(56) References Cited

U.S. PATENT DOCUMENTS

| 7,968,432 B2 | 6/2011 | Tamura et al. |
| 8,101,504 B2 | 1/2012 | Nagasawa |

(Continued)

FOREIGN PATENT DOCUMENTS

| CN | 1967783 A | 5/2010 |
| JP | 2013-157545 A | 8/2013 |

(Continued)

OTHER PUBLICATIONS

International Search Report (PCT/ISA/210) dated May 28, 2015, by the Korean Intellectual Property Office as the International Searching Authority for International Application No. PCT/KR2015/003696.

(Continued)

*Primary Examiner* — Brian Turner
(74) *Attorney, Agent, or Firm* — Buchanan Ingersoll & Rooney PC

(57) ABSTRACT

Disclosed are a laser processing method for cutting a semiconductor wafer having a metal layer formed thereon and a laser processing device. The disclosed laser processing method transmits a plurality of laser beams, which propagate coaxially, to the semiconductor wafer, thereby forming focusing points in positions adjacent to a surface of the metal layer, which constitutes a boundary with the semiconductor wafer, and to one surface of the semiconductor wafer, respectively.

20 Claims, 8 Drawing Sheets

(51) Int. Cl.
- *H01L 21/268* (2006.01)
- *H01L 23/544* (2006.01)
- *H01L 21/67* (2006.01)
- *H01S 3/10* (2006.01)
- *H01L 21/02* (2006.01)
- *H01L 21/78* (2006.01)

(52) U.S. Cl.
CPC .. *H01L 21/02381* (2013.01); *H01L 21/02395* (2013.01); *H01L 21/268* (2013.01); *H01L 21/67282* (2013.01); *H01L 21/78* (2013.01); *H01S 3/10* (2013.01); *H01L 21/67092* (2013.01); *H01L 2223/5446* (2013.01)

(56) References Cited

U.S. PATENT DOCUMENTS

| | | | |
|---|---|---|---|
| 2005/0017326 A1 | 1/2005 | Iijima et al. | |
| 2005/0098548 A1* | 5/2005 | Kobayashi | B23K 26/0057 219/121.73 |
| 2005/0202596 A1* | 9/2005 | Fukuyo | B23K 26/0057 438/113 |
| 2006/0108338 A1* | 5/2006 | Nishiwaki | B23K 26/38 219/121.72 |
| 2012/0061356 A1 | 3/2012 | Fukumitsu | |
| 2012/0329246 A1* | 12/2012 | Finn | H01L 21/78 438/462 |
| 2014/0099777 A1 | 4/2014 | Mackh et al. | |
| 2014/0117505 A1* | 5/2014 | Mackh | H01L 23/29 257/620 |

FOREIGN PATENT DOCUMENTS

| | | |
|---|---|---|
| JP | 2013-207099 A | 10/2013 |
| KR | 10-2007-0052227 A | 5/2000 |
| KR | 10-2009-0090264 A | 8/2009 |

OTHER PUBLICATIONS

Written Opinion (PCT/ISA/237) dated May 28, 2015, by the Korean Intellectual Property Office Patent Office as the International Searching Authority for International Application No. PCT/KR2015/003696.

Extended European Search Report dated Jan. 31, 2018, by the European Patent Office in corresponding European Patent Application No. 15793230.2-1211. (10 pages).

* cited by examiner

LASER PROCESSING METHOD FOR CUTTING SEMICONDUCTOR WAFER HAVING METAL LAYER FORMED THEREON AND LASER PROCESSING DEVICE

TECHNICAL FIELD

The present invention relates to a laser processing method and a laser processing apparatus, and more particularly, to a laser processing method of cutting a semiconductor wafer formed with a metal layer using laser, and a laser processing apparatus therefor.

BACKGROUND ART

A laser processing apparatus irradiates a laser beam, which is emitted from a laser oscillator, on an object to be processed using an optical system to perform a laser processing operation, such as marking, exposure, etching, punching, scribing, dicing, etc., on the object by the irradiated laser beam.

Recently, in order to prevent damage to a surface of the object, a method of forming a focusing point inside the object with a transmittance with respect to the laser beam and generating a crack to process the object is highlighted. For example, when a laser beam with a high output power is focused to form a focusing point inside a semiconductor wafer, a modified area is formed around the focusing point so that the crack is generated from the modified area. In addition, a laser beam is moved along a predetermined processing line of the semiconductor wafer to generate a crack row inside the object, and then the crack is extended to an external surface of the semiconductor wafer naturally or by using an external force so that the semiconductor wafer can be cut.

However, there is a disadvantage in that it is impossible to cut a semiconductor wafer with a metal layer using the laser processing method. Since the metal layer is formed to have a thickness of about 10 μm, the laser beam cannot transmit the metal layer with the thickness and thus, the crack to be necessary for the cutting cannot be formed inside the metal layer or the semiconductor wafer. Also, since the metal layer formed on a surface of the semiconductor wafer has high ductility, it is a disadvantage in that a yield is decreased during a cutting operation of the semiconductor wafer.

DETAILED DESCRIPTION OF THE INVENTION

Technical Problem

One or more exemplary embodiments provide a laser processing apparatus and a laser processing method of cutting a semiconductor wafer formed with a metal layer using a laser beam.

Advantageous Effects of the Invention

In a laser processing method according to an embodiment, an object may be easily cut by transmitting plural laser beams proceeding along a coaxial path to cut the object having a metal layer formed on a surface of a semiconductor wafer, focusing the laser beams at a surface of the metal layer that is a boundary with the semiconductor wafer and a position adjacent to the surface of the semiconductor wafer that is a boundary with the metal layer, and forming focusing points respectively. Also, the laser processing method can be simpler since it is not necessary to perform a pre-process of coating a protective layer to protect chips and to perform a cleaning process to remove contamination material after the cutting process.

BEST MODE

Figure 1:
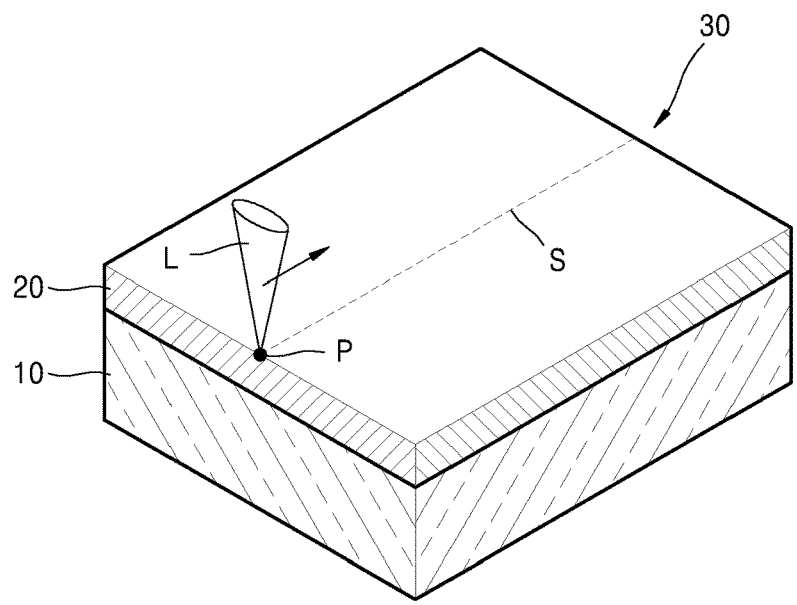
FIGS. 1 through 4 are diagrams illustrating a general laser processing method of processing a semiconductor wafer with a metal layer.

Reference will now be made in detail to embodiments, examples of which are illustrated in the accompanying drawings. The embodiments set forth herein are not intended to limit the scope of the present invention. Rather, these embodiments are provided to explain aspects of the present invention to one of ordinary skill in the art. In the drawings, like reference numerals refer to like elements throughout, and sizes or thicknesses of elements may be exaggerated for clarity of explanation. It will be understood that when a material layer is referred to as being "on" a substrate or another layer, the material layer nay be directly on the substrate or the other layer, or another third layer may be present therebetween. In addition, a material referred to as being used to form each layer is just an example, and another material may also be used.

FIGS. 1 through 4 are diagrams illustrating a general laser processing method of processing a semiconductor wafer 10 formed with a metal layer 20.

Referring to FIG. 1, an object 30 to be processed is made of a semiconductor wafer 10 and a metal layer 20 formed on top surface of the semiconductor 10. Here, the semiconductor wafer 10 may be a substrate usable in a general semiconductor process and may include Silicon (Si), Silicon Carbide (Sic), Gallium Arsenide (GaAs) or Sappire, for example. The semiconductor wafer 10 may include one of various semiconductor materials. The metal layer 20 may be a conductive material usable in a general semiconductor process and may include Copper (Cu), Molybdenum (Mo), or Gold (Au), for example. The metal layer 20 may include one of various metal components having a high conductivity. A laser beam L is focused on the surface of the metal layer 20 to form a focusing point P using laser processing apparatus (not illustrated). Thus, a groove may be formed around the focusing point P of the surface of the metal layer 20 due to laser ablation.

Figure 2:
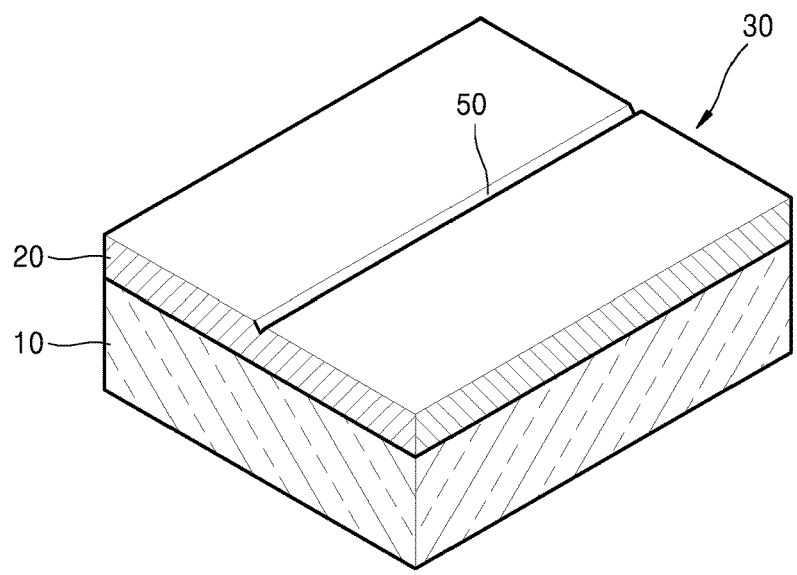
Figure 3:
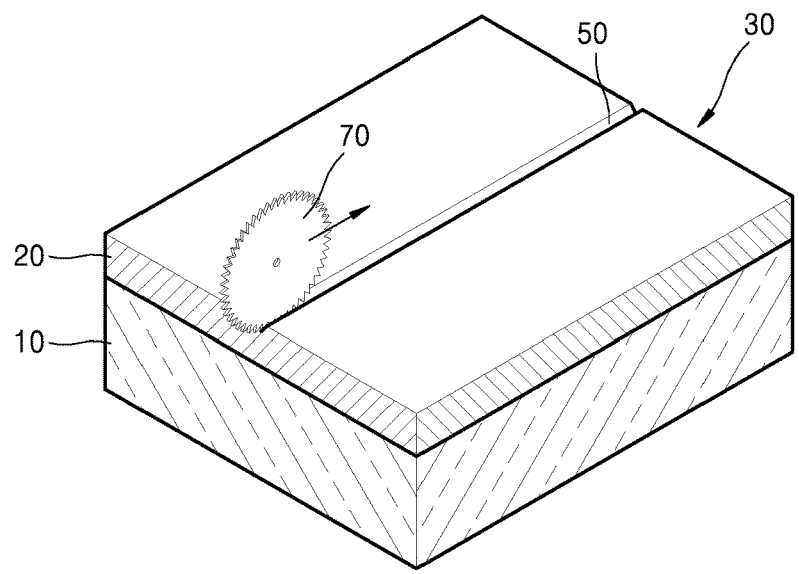
Figure 4:
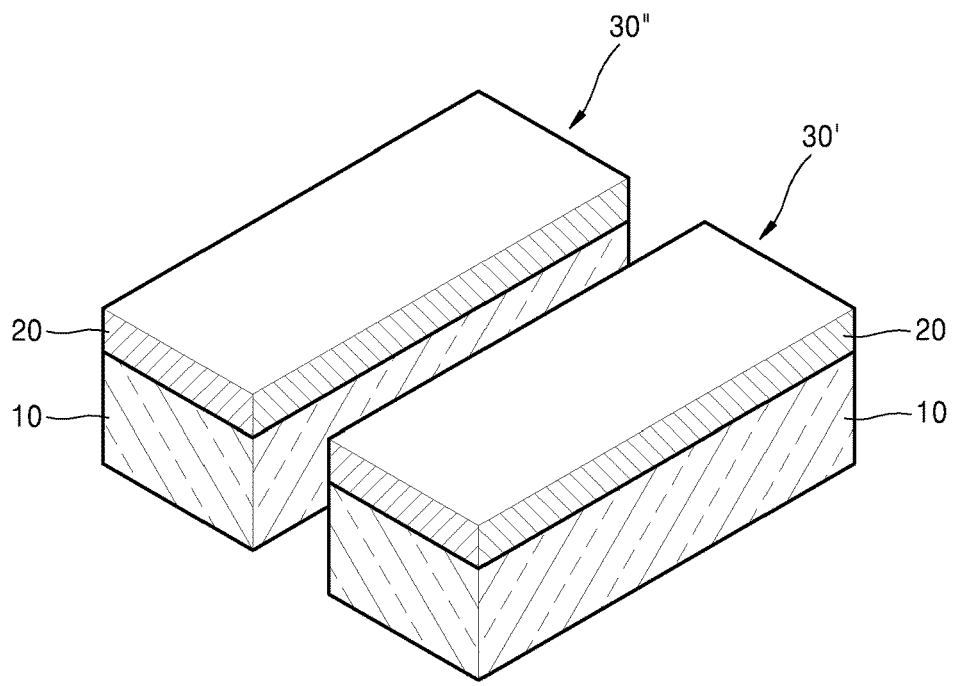

Referring to FIG. 2, when the object 30 is moved along a predetermined processing line S, the focusing point P is moved and thus a groove line 50 is formed to have a depth on the surface of the metal layer 20 along the predetermined processing line S. Referring to FIG. 3, a blade 70 is located on the groove line 50 and then is moved along the groove line 50 to perform a sawing operation such that the object 30 splits into a plurality of chips 30' and 30" as illustrated in FIG. 4.

The above-described laser processing method forms the groove line 50 using the laser beam L and then cuts the object 30 using a mechanical apparatus, such as the blade 70. However, this laser processing method needs a pre-coating process on a protection layer (not illustrated) to protect the chips 30' and 30". Also, an additional cleaning process is required to remove contamination materials after the cutting operation. Therefore, it has a problem that the laser processing method becomes complicated.

Figure 5:
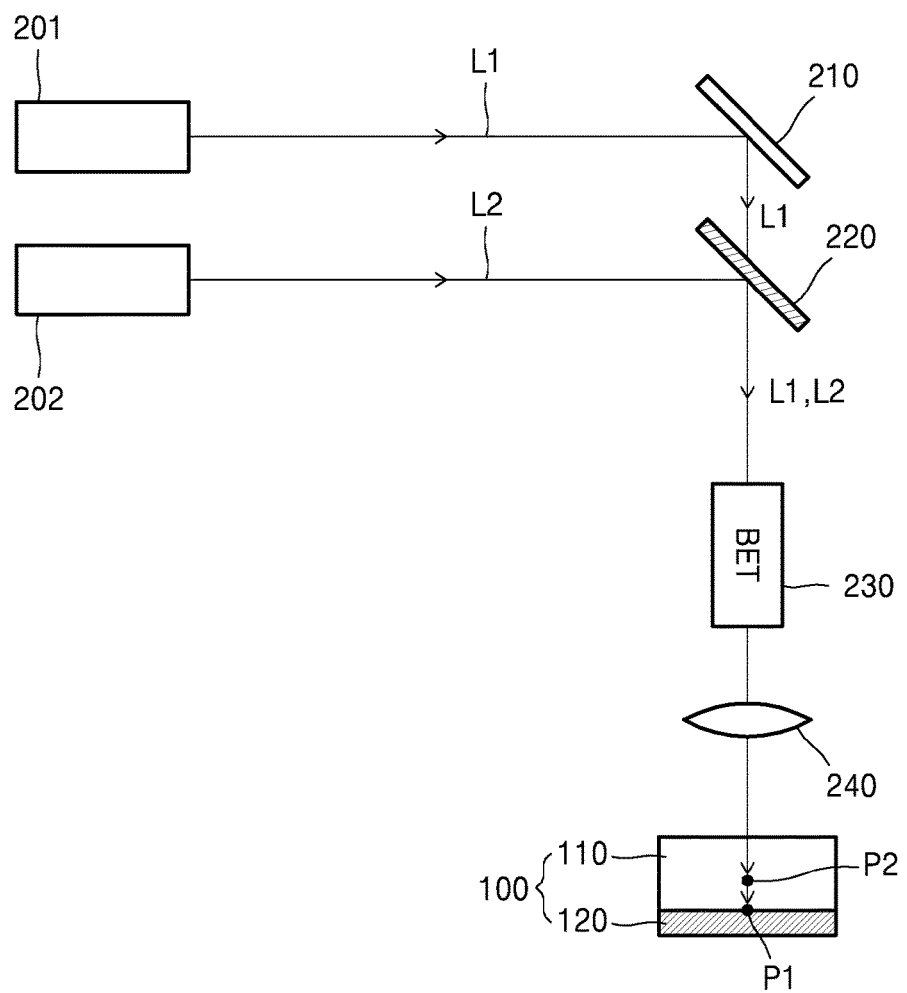
FIG. 5 is a block diagram illustrating a laser processing apparatus according to an example embodiment of the present invention.

FIG. 5 is a block diagram illustrating a laser processing apparatus according to an example embodiment of the present invention.

Referring to FIG. 5, a laser processing apparatus according to the present embodiment may include a plurality of laser light sources 201 and 202 to emit a plurality of laser beams L1 and L2, and an optical system to control the plurality of laser beams L1 and L2 to pass through a coaxial path to be incident on an object to be processed, more specifically, a semiconductor wafer 110. The object 100 includes the semiconductor wafer 110 and a metal layer 120 formed on one surface of the semiconductor wafer 110 (that is, a lower surface of the semiconductor wafer 110 in FIG. 5). Here, the semiconductor wafer 110 may be a substrate usable in a general semiconductor process and may include Silicon (Si), Silicon Carbide (Sic), Gallium Arsenide (GaAs) or Sappire, for example. The semiconductor wafer 10 may include one of various semiconductor materials. The metal layer 20 may be a conductive material usable in a general semiconductor process and may include Copper (Cu), Molybdenum (Mo), or Gold (Au), for example. The metal layer 20 may include one of various metal components having a high conductivity.

The plurality of laser light sources 201 and 202 may include a first laser light source 201 to emit a first laser beam L1 of a pulse type and a second laser light source 202 to emit a second laser beam L2 of a pulse type. The first and second laser beams L1 and L2 may have a wavelength between about 900 nm to about 1700 nm, however, the present invention is not limited thereto. The first laser beam L1 forms a first focusing point P1 on the surface of the metal layer 120 that is a boundary with the semiconductor wafer 110, as described later. And the second laser beam L2 forms a second focusing point P2 at a position disposed adjacent to the surface of the semiconductor wafer 110 (the lower surface of the semiconductor in FIG. 5) that is the boundary with the metal layer 120. The first laser beam L1 may have a pulse width smaller than the second laser beam L2. For example, the first laser beam L1 may have a pulse width of a range of femto seconds (fs), and the second laser beam L2 may have a pulse width of a range of nano seconds (ns). More particularly, the first laser beam L1 may have a pulse width in a range between about 50 to 200 fs, and the second laser beam L2 may have a pulse width in a range between about 300 to 800 ns. However, the present invention is not limited thereto. The first and second laser beams L1 and L2 may have different pulse widths.

The first laser beam L1 emitted from the first laser light source 201 may proceed along a predetermined path, be reflected by a mirror 210, transmit a beam splitter 220, and then be incident on a beam expansion unit 230. Here, an additional optical unit, for example, a half-wave plate, a polarization beam splitter (PBS), etc., may be provided on an optical path between the first laser light source 201 and the mirror 210 if necessary. The second laser beam L2 emitted from the second laser light source 202 may proceed along a predetermined path, be reflected by the beam splitter 220, and then be incident on the beam expansion unit 230. Here, an additional optical unit may be provided on an optical path between the second laser light source 202 and the beam splitter 220 if necessary.

Figure 6:
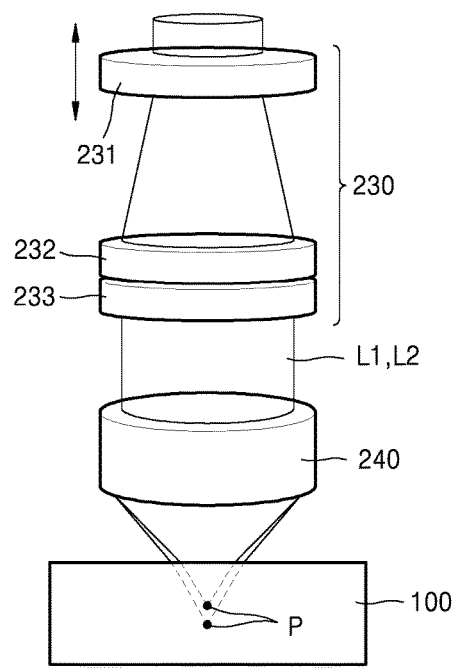
FIG. 6 is an enlarged view of a beam expansion unit and a condenser lens of FIG. 5.

The first and second laser beams L1 and L2 emitted from the beam splitter 220 pass through the beam expansion unit 230 and a condenser lens 240, transmit the semiconductor wafer 110, and then are focused to form first and second focusing points P1 and P2, respectively. FIG. 6 illustrates details of the beam expansion unit 230 and the condenser lens 240 of FIG. 5. Referring to FIG. 6, the beam expansion unit 230 may include a plurality of lenses 231, 232, and 233, and locations of the focusing points P1 and P2 may be changed according to distances among the lenses 231, 232, and 233. Accordingly, the first and second laser beams L1 and L2 incident on the beam expansion unit 230 may be controlled by the beam expansion unit 230 to adjust the locations of the first and second focusing points P1 and P2 formed inside the object 100.

As described above, in the laser processing apparatus, the first laser beam L1 emitted from the first laser light source 201 is reflected by the mirror 210 to be transmitted to the beam splitter 220, and the second laser beam L2 emitted from the second laser light source 202 is reflected by the beam splitter 220. Accordingly, the first and second laser beams L1 and L2 having passed through the beam splitter 220 proceed along a coaxial path. And then, the first and second laser beams L1 and L2 having passed along the coaxial path pass through the beam expansion unit 230 and the condenser lens 240 to be focused at predetermined locations in the object 100 to form the first and second focusing points P1 and P2, respectively. Here, the locations of the focusing points P1 and P2 may be controlled according to distances among the lenses 231, 232, and 233 of the beam expansion unit 230.

Figure 7:
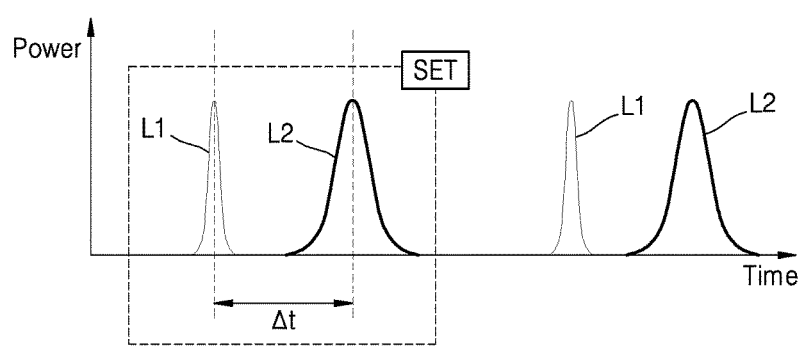
FIG. 7 is a view illustrating waveforms of a first laser beam and a second laser beam, which are emitted from the laser processing apparatus of FIG. 5, incident on an object with respect to a time axis.

Meanwhile, the first and second laser beams L1 and L2 are incident in the object 100 with a time lag. FIG. 7 is a view illustrating waveforms of the first laser beam L1 and the second laser beam L2, which are emitted from the laser processing apparatus of FIG. 5, incident on the object 10 with respect to a time axis. Referring to FIG. 7, a predetermined time Δt after the first laser beam L1 of a pulse type emitted from the first laser light source 201 is incident on the object 100, the second laser beam L2 of a pulse type emitted from the second laser light source 202 is incident on the object 100. Although FIG. 7 illustrates waveforms of the first and second laser beams L1 and L2 without overlapping and interfering each other, it is possible that the first and second laser beams L1 and L2 partially overlap such that the first and second laser beams L1 and L2 interfere each other. A set of the first and second laser beams L1 and L2 having a predetermined time difference Δt may be focused inside the object 100 so that the first and second focusing points P1 and P2 can be formed, and then after the object 100 moves by a predetermined distance, a next set of the first and second laser beams L1 and L2 are incident inside the object 100 so that the first and second focusing points P1 and P2 can be moved.

Hereinafter, a process of cutting the object 100 formed with the semiconductor wafer 110 and the metal layer 120 using the laser processing apparatus illustrated in FIG. 5 will be explained with reference to FIGS. 8A through 12.

Figure 8A:
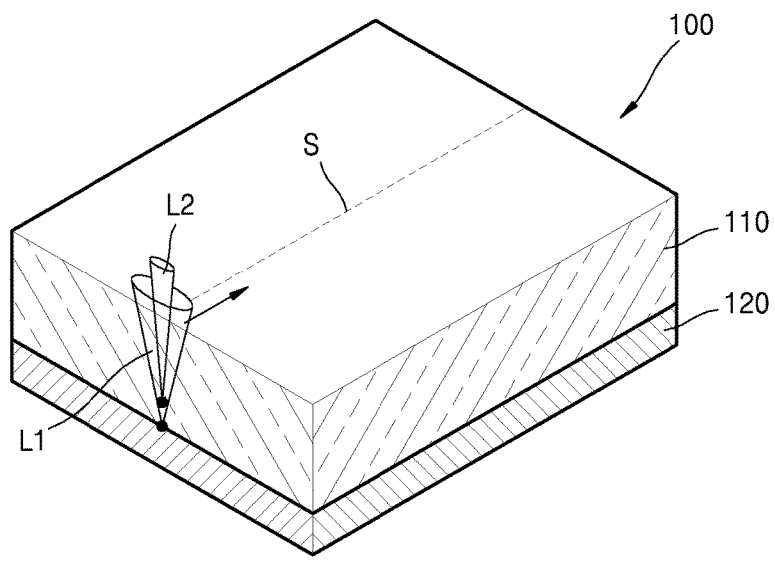
FIGS. 8A through 12 are views illustrating another laser processing method according to another example embodiment of the present invention.
Figure 8B:
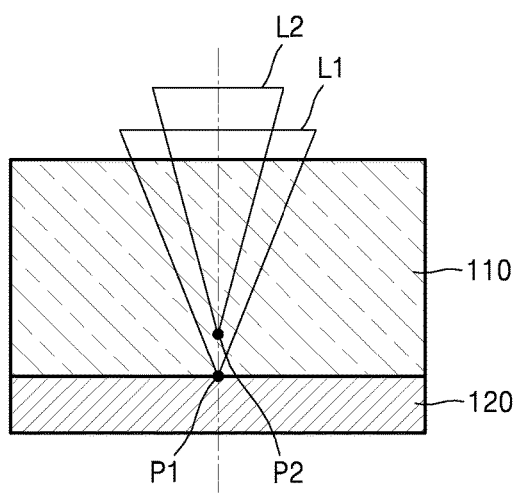

FIG. 8A illustrates a case in which the first and second focusing points P1 and P2 are formed inside the object 100 by the first and second laser beams L1 and L2 emitted from the laser processing apparatus, and FIG. 8B is a side view of FIG. 8A.

Referring to FIGS. 8A and 8B, the object 100 is prepared. The object 100 is made of the semiconductor wafer 110 and the metal layer 120 formed on a lower surface of the semiconductor wafer 110. Here, the semiconductor wafer 110 and the metal layer 120 may include material usable in the semiconductor manufacturing process as described above. And, the first and second laser beams L1 and L2 of a pulse type having passed the condenser lens 240 of the laser processing apparatus of FIG. 5 are transmitted to an inside of the semiconductor wafer 110 to form the first and second focusing points P1 and P2, respectively. The first and second laser beams L1 and L2 are incident on an upper surface of the semiconductor wafer 110 where the metal layer 120 is not formed and transmit the semiconductor wafer 110.

The first and second laser beams L1 and L2 emitted from the laser processing apparatus proceed along the coaxial path to be incident on the semiconductor wafer 110 as stated above. The first and second laser beams L1 and L2 may have a wavelength in a range, for example, about 900 nm to about 1700 nm, however, the present invention is not limited thereto. Here, the first laser beam L1 may have a pulse width smaller than the second laser beam L2. For example, the first laser beam L1 may have a pulse width of a femto second range (for example, about 50 to 200 fs), and the second laser beam L2 may have a pulse width of a nano second range (for example, about 300 to 800 ns). However, the present invention is not limited thereto, and thus the first and second laser beams L1 and L2 may have different pulse widths than the above-described pulse widths.

The first and second laser beams L1 and L2 are incident on the transmittable semiconductor wafer 110 with a time difference to form the first and second focusing points P1 and P2, respectively. As illustrated in FIG. 7, a predetermined time Δt is passed after the first laser beam L1 is incident on the semiconductor wafer 110 to form the first focusing point P1, the second laser beam L2 is incident on the semiconductor wafer 110 to form the second focusing point P2. Therefore, a set of the first and second laser beams L1 and L2 are incident on the semiconductor wafer 110 with a time difference such that the first and second focusing points P1 and P2 are respectively formed at predetermined positions inside the object 100.

The first focusing point P1 is formed when the first laser beam L1 transmits the semiconductor wafer 110 and then is focused at a surface of the metal layer 120 which forms a boundary with the semiconductor wafer 110. Therefore, when the first focusing point P1 is formed on the surface of the metal layer 120, a groove can be formed on the surface of the metal layer 120 due to laser ablation. And, the second focusing point P2 is formed when the second laser beam L2 proceeding along the coaxial path with the first laser beam L2 transmits the semiconductor wafer 110 and is focused at a portion disposed adjacent to the lower surface of the semiconductor wafer 110 which forms the boundary with the metal layer 120. As such, when the second focusing point P2 is formed at the position adjacent to the lower surface of the semiconductor wafer 110, a modified area is formed around the second focusing point P2 such that a crack can be formed and expanded from the modified area to a surface of the semiconductor wafer 110. Here, the second focusing point P2 may be formed at a higher position than the first focusing point P1, and thus the second focusing point P2 may be formed without interference with the groove generated due to the formation of the first focusing point P1.

Figure 9A:
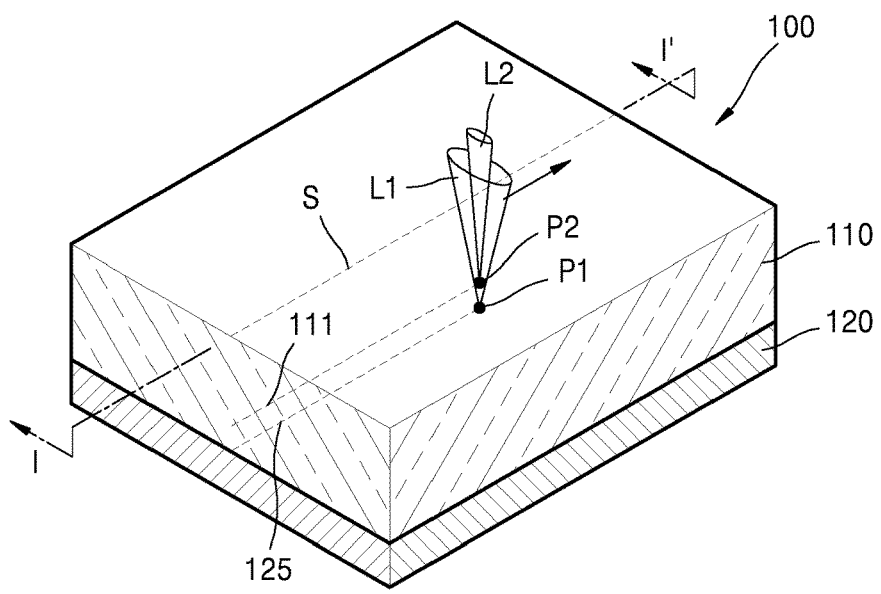
Figure 9B:
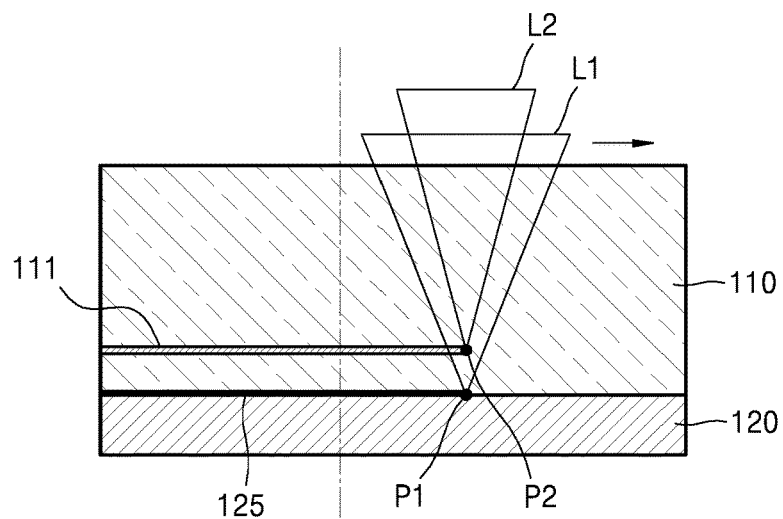

FIG. 9A illustrates a moving state of the first and second focusing points P1 and P2 after the first and second focusing points P1 and P2 are formed inside the object 100. FIG. 9B is a cross-sectional view of a line I-I' of FIG. 9A.

Referring to FIGS. 9A and 9B, in a state that the first and second focusing points P1 and P2 are formed at the surface of the metal layer 120 and a position adjacent to the lower side of the semiconductor wafer 110, respectively, as illustrated in FIGS. 8A and 8B, the object 100 is moved along a predetermined processing line S, and then another set of the first and second laser beams L1 and L2 are incident on the object 100 with the time difference Δt. Accordingly, the first and second focusing points P1 and P2 are formed whiling moving along a predetermined direction (that is, an opposition direction to the movement of the object 100). Meanwhile, the movements of the first and second focusing points P1 and P2 may be performed by movement of the laser processing apparatus instead of the object 100. When the first and second laser beams L1 and L2 are repeatedly incident inside the object 100 while the object 100 is moved as described above, the first and second focusing points P1 and P2 are moved along the predetermined processing line S inside the object 100.

Figure 10:
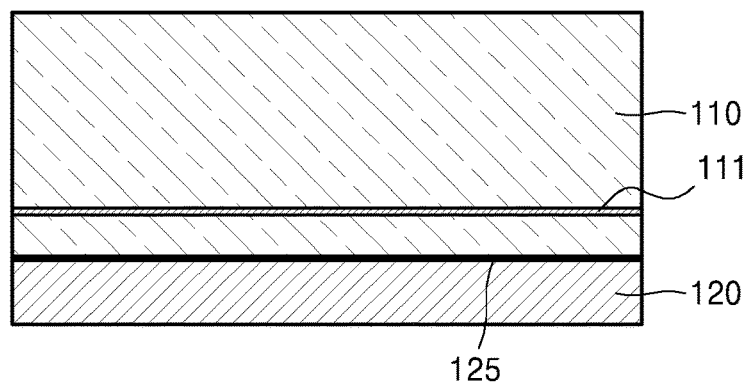

In this process, when the first focusing point P1 is moved, a portion of the metal layer 120 is removed by laser ablation to form an internal groove line along the predetermined processing line S on the surface of the metal layer 120 which is a boundary with the semiconductor layer 110. And, at the position adjacent to the lower surface of the semiconductor wafer 110 which is a boundary with the metal layer 120, a crack row is formed along the predetermined processing line S according to a movement of the second focusing point P2 and expanded to the lower surface of the semiconductor wafer 110. Therefore, when the object 100 stops the movement, the internal groove line 125 and the crack row 111 are formed inside the object 100 as illustrated in FIG. 10.

Figure 11:
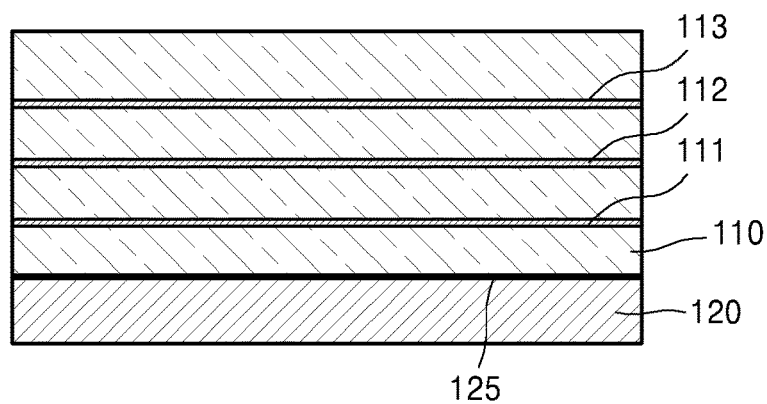

Referring to FIG. 11, in a case where the semiconductor wafer 110 is thick, the internal groove line 125 and the crack row 111 are formed in the object 100, and then, the second laser beam L2 is focused inside the semiconductor wafer 110 to form another focusing point such that at least one internal crack row 112 and 113 is formed additionally by moving the object 100. Meanwhile, it is possible that the internal crack rows 112 and 113 can be simultaneously formed by using one or more additional laser beams (not illustrated) when the internal groove line 125 and the crack row are formed. As such, the object 100 can be more easily cut according to the one or more internal crack rows 112 and 113. Meanwhile, by repeating the process using the first laser beam L1, the internal groove line 125 can be formed deeper than a single process.

Figure 12:
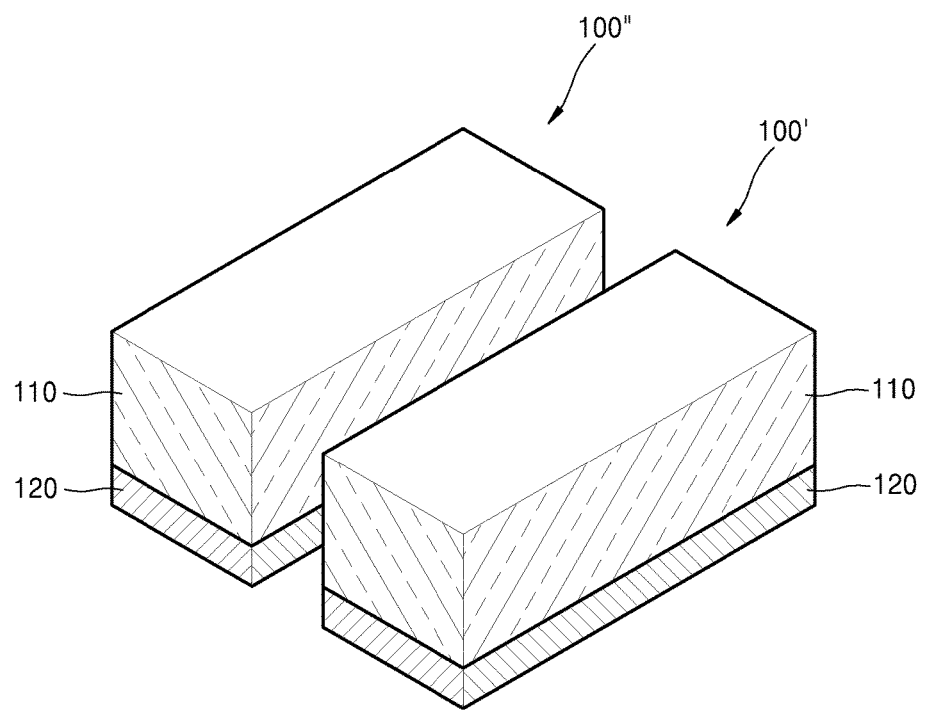

Referring to FIG. 12, in a state in which the internal groove line 125 and the crack row 111 (and internal crack rows 112 and 113) are formed along the predetermined processing line S inside the object 100 as illustrated in FIG. 11, the object 100 can be split into a plurality of chips 100' and 100" by breaking naturally or according to an external impact on the object 100.

As described above, in the laser processing method according to the present embodiment, an object 100 may be easily cut by transmitting the plural laser beams L1 and L2 proceeding along the coaxial path to cut the object 100 having the metal layer 120 formed on the surface of the semiconductor wafer 110, focusing the laser beams L1 and L2 at the surface of the metal layer 120 that is the boundary with the semiconductor wafer 110 and the position adjacent to the surface of the semiconductor wafer 110 that is the boundary with the metal layer 120, and forming the first and second focusing points P1 and P2, respectively. Also, the laser processing method can be simpler since it is not necessary to perform a pre-process of coating a protective layer to protect the chips 100' and 100" and to perform a cleaning process to remove contamination material after the cutting process.

While one or more exemplary embodiments have been described with reference to the figures, it will be understood by those of ordinary skill in the art that various changes in form and details may be made therein.

MODE OF THE INVENTION

According to an exemplary aspect, a laser processing method of processing an object including a semiconductor wafer and a metal layer formed on one surface of the semiconductor wafer by using laser includes passing a plurality of laser beams proceeding along a coaxial path through the semiconductor wafer, and forming focusing points at a surface of the metal layer which forms a boundary with the semiconductor wafer, and at a position disposed adjacent to the surface of the semiconductor wafer, respectively.

The plurality of laser beams may include first and second laser beams of a pulse type, and the method may further include forming a first focusing point on the surface of the metal layer which forms the boundary with the semiconductor layer, by the first laser beam and forming a second focusing point at the position disposed adjacent to the surface of the semiconductor wafer which forms a boundary with the metal layer, by the second laser beam.

The second laser beam may be incident on the semiconductor wafer according to a predetermined time lag from the first laser beam. Here, the first laser beam and the second laser beam may interfere each other or may not interfere each other. The first laser beam may have a smaller pulse width than the second laser beam. For example, the first laser beam may have a pulse width of a femto second range, and the second laser beam may have a pulse width of a nano second range.

The method may further include moving the first focusing point and the second focusing point along predetermined processing line of the object. An internal groove line may be formed on the surface of the metal layer according to a movement of the first focusing point, and a crack row may be formed on the position disposed adjacent to the surface of the semiconductor according to a movement of the second focusing point.

The plurality of laser beams may be incident on the other surface of the semiconductor which is not formed with the metal layer. The plurality of laser beams may have wavelengths in a range between 900 nm to about 1700 nm. The semiconductor wafer may include Si, Sic, GaAs, or sapphire; and the metal layer may include Cu, Mo, or Au.

According to another exemplary aspect, a laser processing apparatus to process an object including a semiconductor wafer and a metal layer formed on one surface of the semiconductor wafer includes a plurality of laser sources to emit a plurality of laser beams, and an optical system to move the plurality of laser beams through a coaxial path to transmit the semiconductor wafer, and to form focusing points at a surface of the metal layer which forms a boundary with the semiconductor wafer, and at a position disposed adjacent to the surface of the semiconductor wafer, respectively.

The plurality of laser sources may include a first laser source to emit a first laser beam of a pulse type to form a first focusing point on the surface of the metal layer, and a second laser source to emit a second laser beam of the pulse type to form a second focusing point on the position disposed adjacent to the surface of the semiconductor wafer.

The invention claimed is:

1. A laser processing method of processing an object including a semiconductor wafer and a metal layer formed on one surface of the semiconductor wafer by using laser, the method comprising:
    passing a plurality of laser beams
        proceeding along a coaxial path through the semiconductor wafer;
        forming focusing points at a surface of the metal layer which forms a boundary with the semiconductor wafer, and at a position disposed adjacent to the surface of the semiconductor wafer, respectively; and
    moving the first focusing point along predetermined processing line of the object wherein an internal groove line is formed on the surface of the metal layer according to a movement of the first focusing point.

2. The laser processing method of claim 1, wherein:
    the plurality of laser beams comprise first and second laser beams of a pulse type; and
    the method further comprises forming a first focusing point on the surface of the metal layer which forms the boundary with the semiconductor wafer, by the first laser beam, and forming a second focusing point at the position disposed adjacent to the surface of the semiconductor wafer which forms a boundary with the metal layer, by the second laser beam.

3. The laser processing method of claim 2, wherein the second laser beam is incident on the semiconductor wafer according to a predetermined time difference from the first laser beam.

4. The laser processing method of claim 3, wherein the first laser beam and the second laser beam interfere each other or do not interfere each other.

5. The laser processing method of claim 3, wherein the first laser beam has a smaller pulse width than the second laser beam.

6. The laser processing method of claim 5, wherein:
    the first laser beam has a pulse width of a femto second range; and
    the second laser beam has a pulse width of a nano second range.

7. The laser processing method of claim 3, further comprising:
    moving the first focusing point and the second focusing point along predetermined processing line of the object.

8. The laser processing method of claim 7, wherein an internal groove line is formed on the surface of the metal layer according to a movement of the first focusing point, and a crack row is formed on the position disposed adjacent to the surface of the semiconductor wafer according to a movement of the second focusing point.

9. The laser processing method of claim 1, wherein the plurality of laser beams are incident on the other surface of the semiconductor wafer which is not formed with the metal layer.

10. The laser processing method of claim 1, wherein the plurality of laser beams have wavelengths in a range between 900 nm to 1700 nm.

11. The laser processing method of claim 1, wherein:
the semiconductor wafer comprises Si, Sic, GaAs, or sapphire; and
the metal layer comprises Cu, Mo, or Au.

12. The laser processing apparatus of claim 11, wherein the plurality of laser beams are configured to be incident on the other surface of the semiconductor wafer which is not formed with the metal layer.

13. The laser processing apparatus of claim 11, wherein the plurality of laser beams have wavelengths in a range between 900 nm to 1700 nm.

14. The laser processing method of claim 1, further comprising:
moving the first focusing point and the second focusing point along predetermined processing line of the object wherein an internal groove line is formed on the surface of the metal layer according to a movement of the first focusing point, and a crack row is formed on the position disposed adjacent to the surface of the semiconductor wafer according to a movement of the second focusing point.

15. A laser processing apparatus configured to process an object including a semiconductor wafer and a metal layer formed on one surface of the semiconductor wafer by using laser, the apparatus comprising:
a plurality of laser sources configured to emit a plurality of laser beams; and
an optical system configured to move the plurality of laser beams through a coaxial path to transmit the semiconductor wafer, and configured to form focusing points at a surface of the metal layer which forms a boundary with the semiconductor wafer, and at a position disposed adjacent to the surface of the semiconductor wafer, respectively and to form an internal groove line on the surface of the metal layer according to a movement of the first focusing point.

16. The laser processing apparatus of claim 15, wherein the plurality of laser sources comprise:
a first laser source configured to emit a first laser beam of a pulse type to form a first focusing point on the surface of the metal layer; and
a second laser source configured to emit a second laser beam of the pulse type to form a second focusing point on the position disposed adjacent to the surface of the semiconductor wafer.

17. The laser processing apparatus of claim 16, wherein the second laser beam is configured to be incident on the semiconductor wafer according to a predetermined time difference from the first laser beam.

18. The laser processing apparatus of claim 17, wherein the first laser beam has a smaller pulse width than the second laser beam.

19. The laser processing apparatus of claim 17, wherein the first focusing point and the second focusing point are configured to be moved along predetermined processing lines.

20. The laser processing apparatus of claim 19, configured to:
form an internal groove line on the surface of the metal layer according to a movement of the first focusing point; and
form a crack row on the position disposed adjacent to the surface of the semiconductor according to a movement of the second focusing point.

* * * * *